(12) United States Patent
Dierksmeier et al.

(10) Patent No.: US 10,654,576 B2
(45) Date of Patent: May 19, 2020

(54) GAS TURBINE ENGINE WITH THERMOELECTRIC COOLING AIR HEAT EXCHANGER

(71) Applicant: Rolls-Royce North American Technologies, Inc., Indianapolis, IN (US)

(72) Inventors: Douglas D. Dierksmeier, Franklin, IN (US); Daniel K. Vetters, Indianapolis, IN (US); Michael A. Karam, Plainfield, IN (US)

(73) Assignee: Rolls-Royce North American Technologies Inc., Indianapolis, IN (US)

( * ) Notice: Subject to any disclaimer, the term of this patent is extended or adjusted under 35 U.S.C. 154(b) by 334 days.

(21) Appl. No.: 15/424,175

(22) Filed: Feb. 3, 2017

(65) Prior Publication Data

US 2017/0248076 A1    Aug. 31, 2017

Related U.S. Application Data

(60) Provisional application No. 62/300,460, filed on Feb. 26, 2016.

(51) Int. Cl.
| | |
|---|---|
| *B64D 27/10* | (2006.01) |
| *F02C 7/18* | (2006.01) |
| *B64D 33/08* | (2006.01) |
| *H01L 35/30* | (2006.01) |

(52) U.S. Cl.
CPC ............ *B64D 27/10* (2013.01); *B64D 33/08* (2013.01); *F02C 7/185* (2013.01); *F05D 2260/213* (2013.01); *H01L 35/30* (2013.01); *Y02T 50/671* (2013.01); *Y02T 50/676* (2013.01)

(58) Field of Classification Search
CPC .... F02C 7/12; F02C 7/18; F02C 7/185; H01L 35/00
See application file for complete search history.

(56) References Cited

U.S. PATENT DOCUMENTS

| | | | |
|---|---|---|---|
| 2,990,775 A | 7/1961 | Henson | |
| 5,584,183 A * | 12/1996 | Wright | F25B 21/02 |
| | | | 165/58 |
| 6,481,211 B1 | 11/2002 | Haas | |
| 7,013,636 B2 * | 3/2006 | Iya | F02K 1/822 |
| | | | 60/204 |

(Continued)

FOREIGN PATENT DOCUMENTS

| | | |
|---|---|---|
| EP | 0391609 A1 | 10/1990 |
| EP | 0698730 A2 | 2/1996 |

(Continued)

OTHER PUBLICATIONS

Extended European Search Report, European Application No. 17156615.1-1607, dated Jul. 7, 2017, 8 pages.

(Continued)

*Primary Examiner* — Arun Goyal
*Assistant Examiner* — Henry Ng
(74) *Attorney, Agent, or Firm* — Barnes & Thornburg LLP

(57) ABSTRACT

A gas turbine engine includes a cooling air system, a coolant system, and a thermoelectric heat exchanger adapted for selective operation in response to operational states of the gas turbine engine.

18 Claims, 4 Drawing Sheets

(56) References Cited

U.S. PATENT DOCUMENTS

| | | | |
|---|---|---|---|
| 7,275,927 B2* | 10/2007 | Howsam | A23P 30/20 |
| | | | 425/326.1 |
| 7,478,525 B2 | 1/2009 | Iya et al. | |
| 2003/0234008 A1 | 12/2003 | Van Winkle | |
| 2004/0045594 A1* | 3/2004 | Hightower | F02C 6/18 |
| | | | 136/205 |
| 2009/0084112 A1 | 4/2009 | Ham | |
| 2009/0151321 A1 | 6/2009 | Jarmon et al. | |
| 2010/0011781 A1* | 1/2010 | Lents | B64D 13/00 |
| | | | 62/3.7 |
| 2010/0236595 A1* | 9/2010 | Bell | F01P 9/06 |
| | | | 136/205 |
| 2012/0118345 A1 | 5/2012 | Stoia et al. | |
| 2012/0240588 A1* | 9/2012 | Patel | F02C 3/16 |
| | | | 60/772 |
| 2013/0213054 A1 | 8/2013 | Rao et al. | |
| 2015/0214458 A1* | 7/2015 | Nandigama | F02B 29/0406 |
| | | | 60/599 |
| 2015/0372214 A1* | 12/2015 | Kim | F02C 6/18 |
| | | | 136/205 |
| 2016/0003502 A1* | 1/2016 | Zelissen | F25B 21/02 |
| | | | 136/205 |
| 2016/0017803 A1* | 1/2016 | Ward | F01D 25/02 |
| | | | 60/772 |
| 2016/0111623 A1* | 4/2016 | Lee | H01L 35/30 |
| | | | 136/208 |
| 2016/0201558 A1* | 7/2016 | Pal | F01D 25/12 |
| | | | 60/39.83 |
| 2016/0319697 A1* | 11/2016 | Akin | H01L 35/32 |
| 2017/0058777 A1* | 3/2017 | Army | F16K 49/00 |

FOREIGN PATENT DOCUMENTS

| | | |
|---|---|---|
| EP | 1746257 A2 | 1/2007 |
| EP | 2581554 A2 | 4/2013 |
| JP | 2008 232086 A | 10/2008 |
| JP | 2008232086 A | 10/2008 |

OTHER PUBLICATIONS

Extended European Search Report for Application No. 17156615.1-1607, dated Jul. 7, 2017, 8 pages.

\* cited by examiner

| COOLING AIR - (AIR/FUEL COOLED) | GROUND IDLE | TAKEOFF | CLIMB | CRUISE | FLIGHT IDLE |
|---|---|---|---|---|---|
| NO POWER | X | | | | |
| POWER OUT | | | | X | |
| POWER IN (INCREASE Hx EFFECTIVENESS) | | X | X | | |
| POWER IN (REVERSE MODE) | | | | | X |

*FIG. 5*

GAS TURBINE ENGINE WITH THERMOELECTRIC COOLING AIR HEAT EXCHANGER

CROSS REFERENCE TO RELATED APPLICATIONS

This application claims priority to and the benefit of U.S. Provisional Patent Application No. 62/300,460, filed 26 Feb. 2016, the disclosure of which is now expressly incorporated herein by reference.

FIELD OF THE DISCLOSURE

The present disclosure relates generally to gas turbine engines, and more specifically to the interaction of subsystems used in gas turbine engines.

BACKGROUND

Gas turbine engines are used to power aircraft, watercraft, power generators, and the like. Gas turbine engines typically include a compressor, a combustor, and a turbine. The compressor compresses air drawn into the engine and delivers high pressure air to the combustor. In the combustor, fuel is mixed with the high pressure air and is ignited. Exhaust products of the combustion reaction in the combustor are directed into the turbine where work is extracted to drive the compressor and, sometimes, an output shaft, fan, or propeller.

Cooling air is often routed to various portion of gas turbine engines to remove heat therefrom. Cooling air may be cooled by a heat exchanger before being distributed to those portions of the gas turbine engine.

SUMMARY

The present disclosure may comprise one or more of the following features and combinations thereof.

According to an aspect of the present disclosure, a gas turbine engine may include a cooling air system adapted to provide cooling air to portions of the gas turbine engine, a coolant system adapted to provide coolant for heat exchange with the cooling air system of the gas turbine engine, and a thermoelectric heat exchanger including a cooling air passageway fluidly coupled to the cooling air system to conduct cooling air of the cooling air system therethrough, a coolant passageway fluidly coupled to the cooling system to conduct coolant of the coolant system therethrough, and a thermoelectric section configured in thermal communication with each of the cooling air passageway and the coolant passageway.

In some embodiments, the gas turbine engine may include a controller configured to determine an operational state of the gas turbine engine and to selectively apply voltage across the thermoelectric section based on the operational state of the gas turbine engine.

In some embodiments, the coolant system may include one of a coolant air system having air as the coolant and a fuel system having fuel as the coolant.

In some embodiments, gas turbine engine may be configured to provide propulsion for an aircraft and the operational state of the gas turbine engine includes one of ground idle, takeoff, climb, cruise, and flight idle.

In some embodiments, the controller may be configured to extract electric power from the thermoelectric section in response to determination that the operational state of the gas turbine engine is cruise.

In some embodiments, the controller may be configured to apply voltage across the thermoelectric section to direct current through the thermoelectric section in a first direction in response to determination that the operational state of the gas turbine engine is one of takeoff and climb to encourage heat transfer through the thermoelectric section from the cooling air passageway to the coolant passageway.

In some embodiments, the thermoelectric controller may be configured to apply voltage across the thermoelectric section to direct current through the thermoelectric section in a second direction in response to determination that the operational state of the gas turbine engine is flight idle.

In some embodiments, the thermoelectric section may include a number of electrically connected thermoelectric layers and the cooling air passageway includes a number of cooling air conduits each having at least one wall in thermal communication with at least one of the thermoelectric layers.

In some embodiments, at least one of the number of cooling air conduits may have a circumferential width that is tapered along a radial direction.

In some embodiments, the coolant passageway may include a number of coolant conduits each having at least one wall in thermal communication with at least one of the thermoelectric layers and each of the coolant conduits defines a coolant flow path that extends radially in communication with a turnaround passage of the coolant passageway.

According to another aspect of the present disclosure, a gas turbine engine for generating power from combustion of fuel may include a compressor configured to pressurized air, a combustor configured to receive pressurized air from the compressor and fuel for combustion to yield combustion products, a turbine configured to receive and expand combustion products from the combustor to drive rotation around a central axis, and a thermoelectric heat exchanger including a cooling air passageway fluidly coupled to the compressor to receive pressurized air through the cooling air passageway, a coolant passageway fluidly coupled to a coolant system to receive coolant through the coolant passageway, and a thermoelectric section configured in thermal communication with each of the cooling air passageway and the coolant passageway.

In some embodiments, the gas turbine engine may include a controller configured to determine an operational state of the gas turbine engine and to selectively apply voltage across the thermoelectric layer based on the operational state of the gas turbine engine.

In some embodiments, the controller may be configured to selectively provide electric power generated by the thermoelectric section to a load of the gas turbine engine.

In some embodiments, the gas turbine engine may be adapted to provide propulsion for an aircraft and the operational state of the gas turbine engine includes one of ground idle, takeoff, climb, cruise, and flight idle.

In some embodiments, the controller may be configured to apply voltage across the thermoelectric section to direct current through the thermoelectric section in a first direction in response to determination that the operational state of the gas turbine engine is one of takeoff and climb to encourage heat transfer through the thermoelectric section from the cooling air passageway to the coolant passageway.

In some embodiments, the thermoelectric controller may be configured to apply voltage across the thermoelectric section to direct current through the thermoelectric section in a second direction in response to determination that the operational state of the gas turbine engine is flight idle.

In some embodiments, the thermoelectric heat exchanger may be configured to provide no electric power to the thermoelectric section in response to determination that the operational state of the gas turbine engine is ground idle.

According to another aspect of the present disclosure, a method of operating a gas turbine engine for providing propulsion for an aircraft may include determining an operational state of the gas turbine engine, based on the determined operational state, determining whether excess thermal differential exists between a cooling air system and a coolant system of the gas turbine engine, based on the determined operational state, selectively: applying voltage across a thermoelectric section of a thermoelectric heat exchanger of the gas turbine engine in response to determination that excess thermal differential does not exist, or extracting electric power from the thermoelectric section of the thermoelectric heat exchanger in response to determination that excess thermal differential does exist.

In some embodiments, selectively applying voltage across the thermoelectric section of the thermoelectric heat exchanger may include, in response to determination that an excess thermal differential does not exist based on the determined operational state, selectively directing current through the thermoelectric section in a first direction to encourage heat transfer through the thermoelectric section from the cooling air system to the coolant system based on the determined operational state.

In some embodiments, selectively applying voltage across the thermoelectric section of the thermoelectric heat exchanger may include, in response to determination that an excess thermal differential does not exist based on the determined operational state, selectively directing current through the thermoelectric section in a second direction.

These and other features of the present disclosure will become more apparent from the following description of the illustrative embodiments.

BRIEF DESCRIPTION OF THE DRAWINGS

FIG. 5 is a table of exemplary operational states of the gas turbine engine of FIG. 1 adapted for use in aircraft propulsion and their general correspondence to an electrical power IN (provided) condition, an electrical power OUT (extracted) condition, and a No Power condition relative to the thermoelectric system.

DETAILED DESCRIPTION OF THE DRAWINGS

Figure 1:
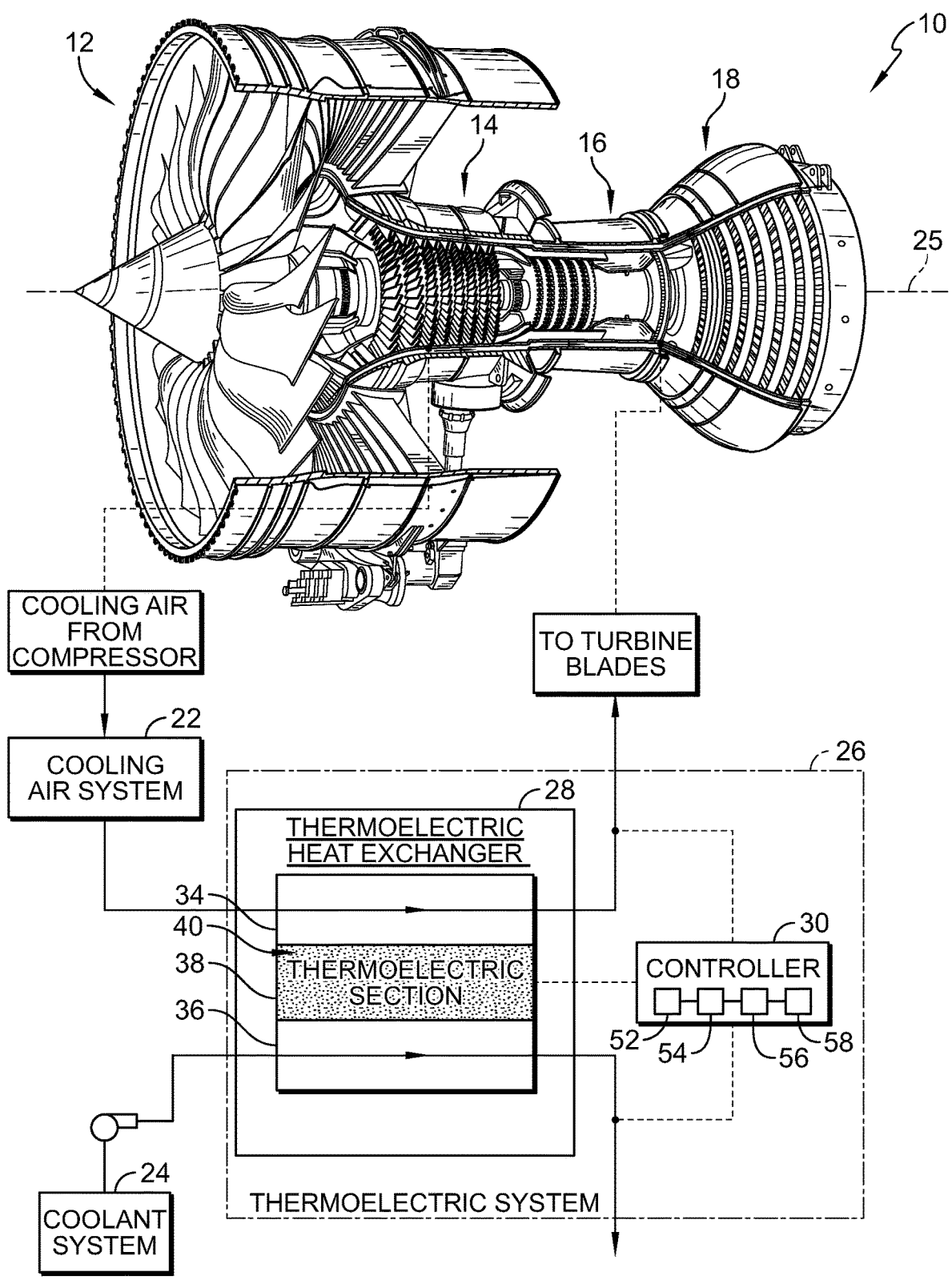
FIG. 1 is a partially diagrammatic gas turbine engine diagrammatically showing that the gas turbine engine includes a turbine engine cooling air system, a coolant system, and a thermoelectric system for controlling heat exchange between air from the cooling air system and coolant from the coolant system provided by a thermoelectric heat exchanger and a turbine engine controller in communication with various sensors, and showing that the thermoelectric heat exchanger has a cooling air passageway, a coolant passageway, and a thermoelectric section disposed between and in thermal communication with each of the cooling air passageway and the coolant passageway.

For the purposes of promoting an understanding of the principles of the disclosure, reference will now be made to a number of illustrative embodiments illustrated in the drawings and specific language will be used to describe the same.

An illustrative gas turbine engine 10 includes a fan 12, a compressor 14, a combustor 16, and a turbine 18 as shown in FIG. 1. The fan 12 draws air into the compressor 14 that compresses and delivers the air to the combustor 16. The combustor 16 mixes fuel with the compressed air from the compressor 14 and combusts the mixture. The hot, high-pressure exhaust products of the combustion reaction in the combustor 16 are directed into the turbine 18 to cause turbine blades 20 to rotate about an axis 25 to drive fan 12 and compressor 14.

In the illustrative embodiment, gas turbine engine 10 includes a cooling air system 22, a coolant system 24, and a thermoelectric system 26 for governing heat exchange between systems 22, 24 as shown in FIG. 1. Cooling air system 22 illustratively provides cooling air from the compressor 14 to various portions of the gas turbine engine 10, for example, the turbine blades 20 for removing heat (cooling). Coolant system 24 illustratively provides cooling medium ("coolant") for heat exchange with the cooling air of the cooling air system 22 before the cooling air is directed to those portions of the engine 10 requiring cooling (e.g., turbine blades 20). Thermoelectric system 26 is configured to regulate heat exchange between the cooling air of the cooling air system 22 and the coolant of the coolant system 24.

In the illustrative embodiment, thermoelectric system 26 includes a thermoelectric heat exchanger 28 configured to receive cooling air and coolant therethrough in controlled thermal communication with each other, and a controller 30 configured to govern operation of thermoelectric heat exchanger 28 as shown in FIG. 1. Thermoelectric heat exchanger 28 illustratively includes a cooling air passageway 34 fluidly coupled with the cooling air system 22 to receive cooling air therefrom, a coolant passageway 36 fluidly coupled with the coolant system 24 to receive coolant therefrom, and a thermoelectric section 38 in thermal communication with each of cooling air passageway 34 and coolant passageway 36. Thermoelectric section 38 is illustratively disposed between the cooling air passageway 34 and the coolant passageway 36 as a thermal conduit through which heat can be transferred between the systems 22, 24.

As explained in detail below, thermoelectric section 38 is selectively operable to regulate the amount and direction of heat transfer therethrough as suggested in FIG. 1. For example, thermoelectric system 26 can illustratively operate to drive additional heat transfer from cooling air system 22 to coolant system 24. Driving additional heat transfer from cooling air system 22 to coolant system 24 can provide additional cooling to the cooling air system 22 during desired periods and can permit a reduction in the overall size of the heat exchanger 28 when compared with traditional exchangers without reducing the heat transfer capacity thereof.

Thermoelectric system 26 regulates heat transfer between cooling air system 22 and coolant system 24 by selective operation of thermoelectric section 38 as suggested in FIG. 1. As discussed in detail below, thermoelectric section 38 illustratively includes a thermoelectric material 40 having thermoelectric properties. In the illustrative embodiment, thermoelectric section 38 is configured such that the heat flow (rate and direction) through the thermoelectric material 40 is regulated by selectively governing the flow of electric current through thermoelectric section 34. Under certain conditions, thermoelectric section 34 can also produce electric power from an imposed thermal differential for extraction to other loads. Devices operating under similar principles are sometimes referred to Peltier and/or Seebeck devices.

Figure 2:
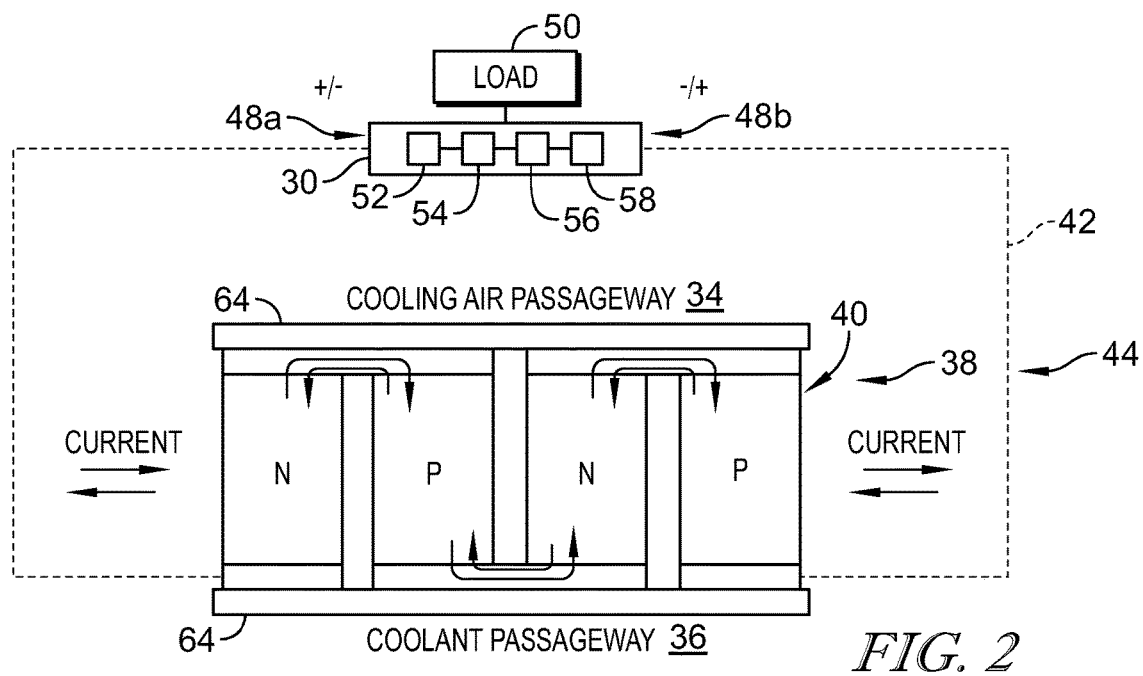
FIG. 2 is a diagrammatic view of an illustrative embodiment of the thermoelectric system of the gas turbine engine of FIG. 1 showing that thermoelectric section includes a circuit of semiconductor materials including positively charged (P-type) and negatively charged (N-type) thermoelectric materials arranged in alternating series to provide a thermoelectric circuit for receiving current therethrough in a first direction (counter-clockwise) encouraging transfer of heat through the thermoelectric section from the lubrication passageway to the fuel passageway, and in a second direction (clockwise) discouraging transfer of heat through the thermoelectric section from the lubrication passageway to the fuel passageway.
Figure 3:
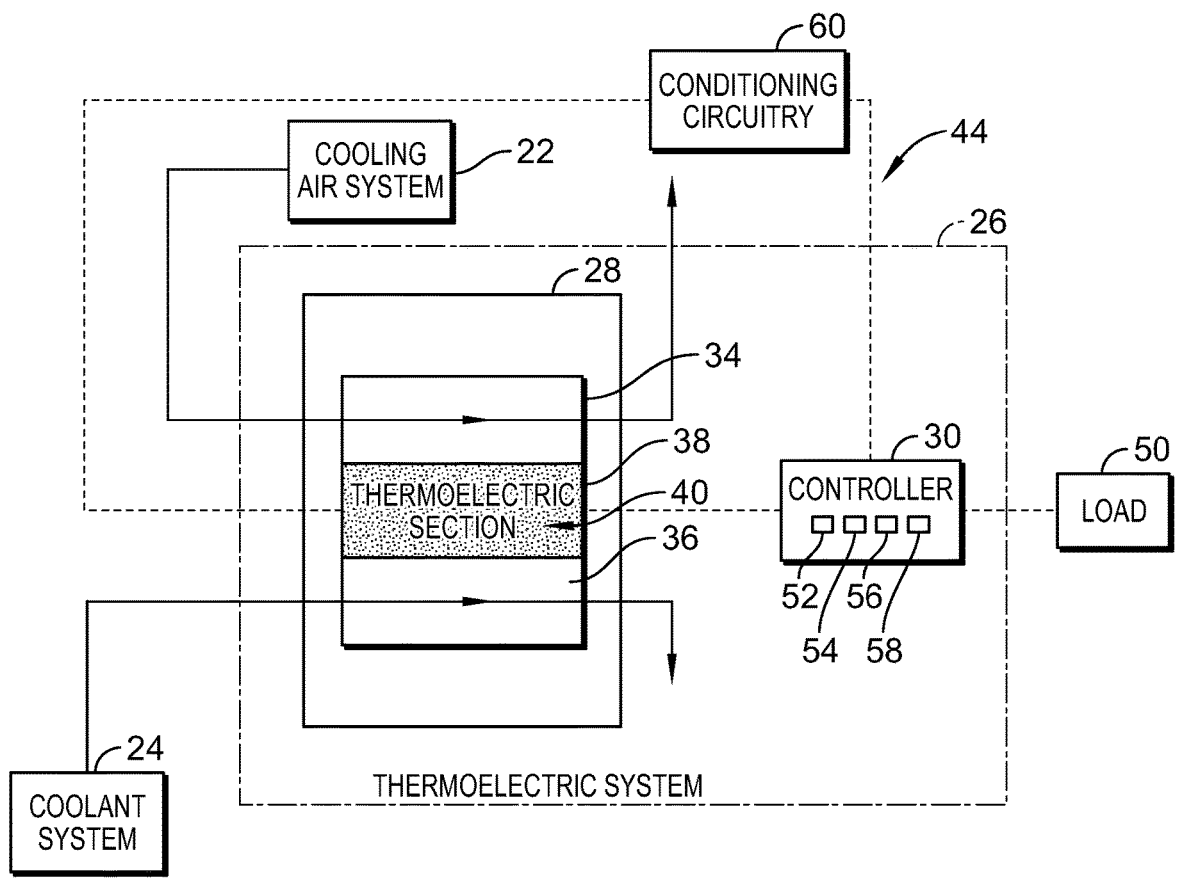
FIG. 3 is a diagrammatic view of the thermoelectric system included in the gas turbine engine of FIG. 1 showing that the turbine engine controller of the thermoelectric system includes circuitry for determining an operational state of the gas turbine engine and for selectively operating to supply electric power to the thermoelectric layer or to extract electric power from the thermoelectric layer based on the determined operational state.

Controller 30 illustratively governs operation of thermoelectric heat exchanger 28 to regulate the heat flow (rate and direction) between cooling air system 22 and coolant system 24 as suggested in FIGS. 1-4. As shown in FIGS. 2 and 3, controller 30 is illustratively electrically connected to thermoelectric section 38 by wiring 42 to provide a thermoelectric circuit 44. Controller 30 illustratively regulates the electric power through thermoelectric circuit 44 to govern heat transfer between systems 22, 24.

In the illustrative embodiment, controller 30 determines a desired operation of thermoelectric heat exchanger 28 based on operational scenarios and conditions of engine 10. As described in detail below, controller 30 executes the desired operation accordingly by selectively extracting electric power from, providing electric power to, or to have no power exchange with thermoelectric section 38. Having no power exchange (no power provided to or extracted from) with thermoelectric section 38 allows natural heat transfer to occur through thermoelectric heat exchanger 28. Providing power to thermoelectric section 38 can augment (increase or decrease) the natural heat transfer according to the configuration and amount of power through thermoelectric section 38. Extracting power from thermoelectric section 38 can effectively provide additional cooling to systems 22, 24 while producing useful electric power.

Controller 30 determines the desired operation of thermoelectric heat exchanger 26 based on operational scenarios and conditions of engine 10. The specific operational scenarios of gas turbine engines themselves can vary according to the adapted use of the engine 10. In the illustrative embodiment, gas turbine engine 10 is adapted for use in an aircraft and heat exchange between cooling air system 22 and coolant system 24 is described in the context of aircraft operational states including ground idle, takeoff, climb, cruise, and flight idle. In some embodiments, gas turbine engine 10 may be adapted for any known use including stationary and/or mobile electric power generation, direct and/or indirect propulsion of any manner of vehicle and/or device, and/or combinations thereof, and operational states may vary accordingly.

Controller 30 illustratively determines the operational scenarios of the engine 10 based on the operational conditions of engine 10. Controller 30 illustratively receives information from sensors 42a, 42b, 42c configured to detect and send signals indicating an operating parameter of the engine 10. Controller 30 illustratively receives the information from sensors 42a, 42b, 42c to determine the operational scenarios of the engine 10.

In the illustrative embodiment as shown in FIG. 2, thermoelectric material 40 is embodied as a number of oppositely charged (doped) semiconductor materials. Thermoelectric materials 40 illustratively include an alternating line of N-type and P-type semiconductor materials extending between cooling air passageway 34 and the coolant passageway 36 such that one end of each cooling air passageway 34 and the coolant passageway 36 is in thermal contact with one of passageways 34, 36. Adjacent pairs of N-type and P-type semiconductor materials are electrically connected to each other near to one of the cooling air passageway 34 side and the coolant passageway 36 side in alternating sequence along the flow of electric current. Thermoelectric circuit 44 is illustratively formed partially by thermoelectric material 40 to receive electric current therethrough.

Controller 30 regulates amount and direction of electric current through thermoelectric section 28 to govern heat exchange. Controller 30 regulates the direction of electric current directed through thermoelectric material 40 by selective application of the polarity of the voltage applied to thermoelectric section 38. Controller 30 selectively applies voltage to thermoelectric section 38 with particular polarity by inducing either a positive or negative pole at one terminal 48a, 48b, and the other of a positive or negative pole at the other terminal 48a, 48b. As shown in FIGS. 2 and 3, controller 30 thus selectively directs current through thermoelectric section 38 in a first direction (counter-clockwise) or a second direction (clockwise).

If controller 30 determines that the desired control requires a certain amount of heat transfer between cooling air system 22 and coolant system 24, controller 30 illustratively delivers electric power through thermoelectric circuit 44 with polarity according to the desired heat flow. If instead, controller 30 determines that the desired control requires extraction of electrical power from thermoelectric section 34, controller 30 directs electric power generated by thermoelectric section 38 to a load 50 of the gas turbine engine 10. Heat within cooling air system 22 and coolant system 24 can therefore be used according to gas turbine engine 10 operation.

In the illustrative embodiment as shown in FIGS. 2 and 3, current flow through thermoelectric section 38 in the first direction (counter-clockwise) causes thermoelectric material 40 to encourage heat flow from cooling air passageway 34 to coolant passageway 36. Current flow through thermoelectric section 38 in the second direction (clockwise) causes thermoelectric material 40 to discourage heat flow from cooling air passageway 34 to coolant passageway 36. Thus, by selectively applying voltage of a particular polarity (and thus current of a particular direction), controller 30 regulates the rate of heat flow through thermoelectric heat exchanger 28. In the foregoing description, the directions of electric current flow are used for non-limiting illustration purposes. In some embodiments, the absolute direction of current flow may differ from the description based on the particular geometric configuration of the thermoelectric section 34.

Returning to the illustrative embodiment as shown in FIGS. 1-3, thermoelectric system 26 operates according to the operating conditions of gas turbine engine 10. When the controller 30 determines that cooling air system 22 may benefit from removal of additional heat (i.e., providing additional cooling) than is available and/or useful within the coolant system 24, the controller 30 illustratively extracts electrical power from thermoelectric section 38 generated by thermoelectric material 40, effectively serving as an additional heat sink. In one example, electric power may be directed out of thermoelectric section 38 during a cruise operational state of the engine 10.

When controller 30 determines that the natural heat transfer between cooling air system 22 and coolant system 24 is desired, controller 30 is configured to exchange no electric power with thermoelectric section 34. For example, in a ground idle operational state of engine 10, natural heat transfer from cooling air passageway 34 to coolant passageway 36 is sufficient for optimal turbine operation, and according no electric power is exchanged with thermoelectric heat exchanger 28.

When controller 30 determines that cooling air system 22 requires heat removal and/or coolant system 24 would benefit from supplemental heat, controller 30 illustratively directs current through thermoelectric section 38 in the corresponding direction to provide a determined amount of heat flow toward coolant passageway 36; for example, directing current through thermoelectric section 38 in the first direction such that additional heat is driven into coolant system 24 within coolant passageway 36 during a takeoff or climb operational state of the engine 10. Accordingly, coolant of coolant system 24 is warmed.

According to the operational state and conditions, controller 30 may determine that cooling air system 22 desires less than natural heat removal and/or coolant system 24 desires little or no supplemental heat, controller 30 directs current in the second direction to discourage heat flow from cooling air passageway 34 to coolant passageway 36. In this exemplary scenario, controller 30 illustratively determines and directs an amount of current to thermoelectric section 38 required to resist natural heat exchange from cooling air passageway 34 to coolant passageway 36, based on the turbine engine operating conditions. In one example, the controller 30 operates thermoelectric heat exchanger 28 to resist heat flow toward coolant passageway 36 by inputting electric current in the second direction during flight idle of turbine engine 10 when compressed air flow rates are relatively low.

In the illustrative embodiment, the amount of current directed through thermoelectric section 34 has a proportional relationship to the magnitude of the influence that thermoelectric section 34 exerts on heat flow between lubrication system 22 and fuel system 24. A greater amount of current directed through thermoelectric section 34 in a given direction (first or second) yields a greater influence (encouragement or discouragement) on the heat flow between systems 22, 24. A lesser amount of current directed through thermoelectric section 34 in a given direction (first or second) yields a lesser influence on heat flow between systems 22, 24. However, this proportional relationship is not necessarily linear or the same in both directions of electric current.

Referring to FIGS. 2 and 3, controller 30 can operate thermoelectric heat exchanger 28 to extract electric power from thermoelectric section 38 to load 50. In the illustrative embodiment, controller 30 includes electrical circuitry 52 (as shown in FIG. 3) configured for connection of thermoelectric section 38 to load 50 in selective arrangement to either provide or extract electric power from thermoelectric section 38. Electrical circuitry 52 illustratively includes various electrical hardware components configured to selectively provide and extract electrical power to load 50 as dictated by controller 30.

In some embodiments, hardware of electrical circuitry 52 may include any number and combination of active and/or passive components for selectively electrical connection of thermoelectric section 38 to load 50 to exchange power and condition the power exchanged therebetween. In the illustrative embodiment as shown in FIG. 3, electrical circuitry 52 is shown within the box of controller 30, but in some embodiments electrical circuitry 52 may be wholly or partly district from controller 30, but be in communication with and governed by controller 30. In the illustrative embodiment, electric power provided to thermoelectric section 38 is illustratively provided by the same load 50 by configuration of electrical circuitry 52, but in some embodiments electric power may be provided to and extracted from thermoelectric section 38 via different loads.

Controller 30 illustratively includes a processor 54, a memory device 56, and a transceiver 58 as shown in FIGS. 1-3. Transceiver 58 illustratively communicates signals with various gas turbine engine systems and relays the information to processor 54. Processor 54 illustratively executes instructions stored on memory device 56, based on the information from transceiver 58, to determine the desired operation of thermoelectric heat exchanger 28. In some embodiments, thermoelectric system 26 may include conditioning circuitry 60 configured to condition the flow of electric power within wiring 42.

As previously mentioned, controller 30 regulates heat exchange through thermoelectric heat exchanger 28 (and therefore between lubrication and fuel systems 22, 24) according to various operating conditions of gas turbine engine 10 as suggested FIG. 1. Controller 30 determines the operational state of turbine engine 10 based on information received from various sources. In the illustrative embodiment, controller 30 is connected to sensors 52a, 52b, 52c to receive information therefrom. Sensors 52a, 52c, are respectively configured to determine and communicate the temperature of fuel system 24 and lubrication system 22. Sensor 52b is configured to determine and communicate the rotational speed of turbine engine 10.

Controller 30 is configured to determine the operational state of turbine engine 10 based on the received information. In the illustrative embodiment, controller 30 determines the operational state based at least on the rotational speed of turbine engine 10. In some embodiments, controller 30 may determine operational state based on any of turbine engine rotational speed, acceleration (such as engine rotation and/or vehicle movement), position (such as altitude), adapted system control conditions (such as flight controls position), and/or combinations thereof, and may do so based on one or more of past, present, and/or predicted conditions thereof. In some embodiments, operating conditions and operational states may be determined by any direct and/or indirect manner suitable for such control.

Figure 4:
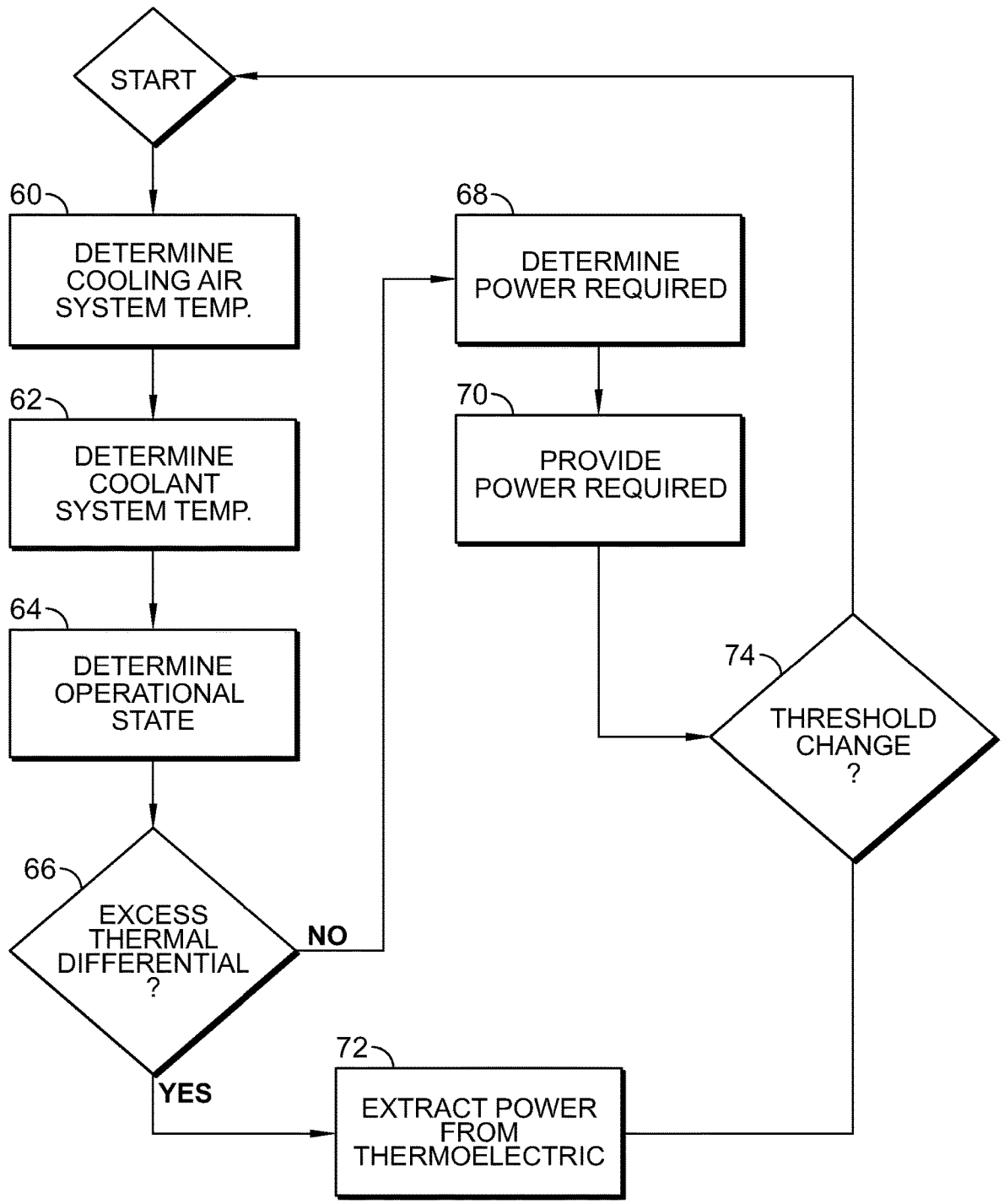
FIG. 4 is process flow diagram of a control sequence of the gas turbine engine of FIG. 1 showing that the control sequence includes determining the temperatures of the cooling air system and the coolant system, determining the operational state of the gas turbine engine, determining whether excess thermal differential exists between the cooling air system and the coolant system based on the determined operational state, and selectively extracting or providing electric power to the thermoelectric system based on the existence of excess thermal differential, and showing that providing electric power to the thermoelectric system includes determining the electric power required by the thermoelectric system and providing the electric power required.

Process steps 60-74 of the process flow diagram of FIG. 4 illustrate operation of thermoelectric system 26 based on operating conditions. In step 60, controller 30 determines the temperature of cooling air system 22. In step 62, controller 30 determines the temperature of coolant system 24. In step 64, controller 30 determines the operational state of turbine engine 10.

In step 66, controller 30 determines whether an excess thermal differential exists. In the illustrative embodiment, excess thermal differential exists if the temperature difference between cooling air system 22 and coolant system 24 exceeds a predetermined threshold for a given operational state of turbine engine 10. The predetermined threshold illustratively varies based on the operational state of turbine engine 10. In some embodiments, the predetermined threshold may vary based on any number of turbine engine operating conditions, for example, the absolute temperatures of cooling air system 22 and coolant system 24. In some embodiments, excess thermal differential and/or predetermined thresholds may be determined by algorithm, lookup chart, and/or any other suitable manner.

If controller 30 determines in step 66 that excess thermal differential exists, the process proceeds to step 72 as shown in FIG. 5. In step 72, controller 30 extracts electric power from thermoelectric section 38 to load 50. In the illustrative embodiment, extracting electric power includes configuration of hardware of electrical circuitry 48, as described above, to electrically connect load 50 to thermoelectric section 38 for extraction. Load 50 is illustratively embodied as a power storage device (e.g., battery) of turbine engine 10, but in some embodiments may include one more of any other electric power demands.

If controller 30 determines in step 66 that excess thermal differential does not exist, the process proceeds to step 68 as shown in FIG. 5. In step 68, controller 30 determines the amount (current) and configuration (voltage and direction) of electric power desired to be directed to thermoelectric section 38 according to the operating conditions. The amount and configuration of electric power required in step 68 is illustratively embodied as the amount and configuration of electric power to be directed through thermoelectric section 38 to produce the desired rate of heat flow across between systems 22, 24 based on the operational state and the operating conditions of turbine engine 10 as discussed above. In the illustrative embodiment, the amount and configuration of electric power is illustratively determined by algorithm, but in some embodiments may include one or more of lookup charts and/or any other suitable manner.

In step 70, controller 30 provides the determined amount and configuration of electric power to thermoelectric section 38, via configuration of hardware of electrical circuitry 52 as described above. In step 74, controller 30 monitors the operational state and operating parameters of turbine engine 10 for threshold changes. If no threshold change is determined, the parameters of the previous step (either 70 or 72) are maintained. If a threshold change is determined, the process returns to the start. In the illustrative embodiment, thresholds changes include changes in turbine engine operational states and exceedance of temperature thresholds of systems 22, 24, but in some embodiments may include any number and/or suitable considerations for re-evaluation of heat exchange within thermoelectric system 26.

The table of FIG. 5 illustrates exemplary operational states of the gas turbine engine 10 adapted for use in aircraft propulsion and their general correspondence to operation of thermoelectric system 26. The table of FIG. 5 is described according to illustrative embodiments of cooling system 24, embodied as either of an air stream and fuel system of engine 10. Operation of thermoelectric system 26 includes any of the preceding descriptions and is not limited by the exemplary correspondence presented with respect to FIG. 6.

In a ground idle state as suggested FIG. 5, thermoelectric system 26 is illustratively configured to have no electric power exchange with thermoelectric section 38 to permit natural heat transfer between systems 22, 24.

In takeoff and cruise states, thermoelectric system 26 is illustratively configured to provide power into thermoelectric section 38 in a Mode A that corresponds to heat flow from cooling air system 22 to coolant system 24. The amount and configuration of electric power provided to thermoelectric section 34 in Mode A illustratively has the same direction of current for both takeoff and cruise states, but can vary in amperage and voltage according to the operational state. In some embodiments, Mode A may include providing electric current in the second direction to reduce heat transfer from cooling air system 22 to coolant 24 below the natural heat transfer state, while still permitting heat exchange therethrough.

In a cruise state as suggested in FIG. 5, thermoelectric system 26 is illustratively configured to extract power from thermoelectric section 38 to load 44.

In a flight idle state as suggested in FIG. 5, thermoelectric system 26 is illustratively configured to provide electric power into thermoelectric section 38 in a Mode B that corresponds to thermoelectric material 35 encouraging heat flow from coolant system 24 to cooling air system 22. For example, in illustrative embodiments in which coolant system 24 is a fuel system of the engine 10, when fuel system 24 has a high temperature it may be advantageous to cool the fuel system 24 by rejecting some heat into the cooling air system 22. Such operational descriptions discussed herein are exemplary in nature and are not intended to limit the scope of operation of engine 10.

In some embodiments, coolant system 22 is embodied as a fuel system of engine 10 and may include pumps, piping, valves and accessories for circulating and delivering fuel. In the illustrative embodiment, air streams are transported through appropriate ducting and may include any dampers, blowers, and/or other accessories as required.

The present disclosure includes devices and methods which can reduce electric power demand from generators of vehicle systems, can reduce cost and weight of systems, and improve thermodynamic performance. The present disclosure includes devices and methods for allowing heat exchange between systems of similar temperatures.

While the disclosure has been illustrated and described in detail in the foregoing drawings and description, the same is to be considered as exemplary and not restrictive in character, it being understood that only illustrative embodiments thereof have been shown and described and that all changes and modifications that come within the spirit of the disclosure are desired to be protected.

What is claimed is:
1. A gas turbine engine comprising
a cooling air system adapted to provide cooling air to interiors of turbine blades of the gas turbine engine,
a coolant system adapted to provide coolant for heat exchange with the cooling air system of the gas turbine engine,
a thermoelectric heat exchanger including a cooling air passageway fluidly coupled to the cooling air system to conduct the cooling air of the cooling air system therethrough, a coolant passageway fluidly coupled to the cooling air system to conduct the coolant of the coolant system therethrough, and a thermoelectric sec- tion configured in thermal communication with each of the cooling air passageway and the coolant passageway; and a controller configured to determine an operational state of the gas turbine engine and to compare a thermal differential between the cooling air system and the coolant system to a predetermined threshold corresponding to the operational state of the gas turbine engine, and to selectively apply voltage across the thermoelectric section and selectively direct current through the thermoelectric section to control a temperature of the cooling air based on the operational state of the gas turbine engine and a result of comparing the thermal differential to the predetermined threshold;

wherein the thermoelectric section facilitates natural heat transfer between the cooling air system and the coolant system when no electric power is exchanged between the thermoelectric section and a load.

2. The gas turbine engine of claim 1, wherein the coolant system comprises a fuel system having fuel as the coolant.

3. The gas turbine engine of claim 1, wherein the gas turbine engine is configured to provide propulsion for an aircraft and the operational state of the gas turbine engine includes one of ground idle, takeoff, climb, cruise, and flight idle.

4. The gas turbine engine of claim 1, wherein the coolant system comprises a coolant air system having air as the coolant.

5. The gas turbine engine of claim 3, wherein the controller is configured to extract electric power from the thermoelectric section in response to determination that the operational state of the gas turbine engine is the cruise.

6. The gas turbine engine of claim 3, wherein the controller is configured to apply the voltage across the thermoelectric section to direct the current through the thermoelectric section in a first direction in response to determination that the operational state of the gas turbine engine is one of the takeoff and the climb to encourage heat transfer through the thermoelectric section from the cooling air passageway to the coolant passageway.

7. The gas turbine engine of claim 3, wherein the controller is configured to apply the voltage across the thermoelectric section to direct the current through the thermoelectric section in a second direction in response to determination that the operational state of the gas turbine engine is the flight idle.

8. A gas turbine engine for generating power from combustion of fuel, comprising
a compressor configured to generate pressurized air,
a combustor configured to receive the pressurized air from the compressor and the fuel for combustion to yield combustion products,
a turbine configured to receive and expand the combustion products from the combustor to drive rotation around a central axis,
a thermoelectric heat exchanger including a cooling air passageway fluidly coupled to the compressor to receive the pressurized air through the cooling air passageway, a coolant passageway fluidly coupled to a coolant system to receive coolant through the coolant passageway, and a thermoelectric section configured in thermal communication with each of the cooling air passageway and the coolant passageway; and
a controller configured to determine an operational state of the gas turbine engine and to compare a thermal differential between the cooling air passageway and the coolant passageway to a predetermined threshold corresponding to the operational state of the gas turbine engine, and to selectively apply voltage across a thermoelectric layer based on a result of comparing the thermal differential to the predetermined threshold, and further configured to monitor the operational state and operating parameters of the gas turbine engine for threshold changes that result from re-determining the operational state.

9. The gas turbine engine of claim 8, wherein the controller is configured to selectively provide electric power generated by the thermoelectric section to a load of the gas turbine engine.

10. The gas turbine engine of claim 8, wherein the gas turbine engine is adapted to provide propulsion for an aircraft and the operational state of the gas turbine engine includes one of ground idle, takeoff, climb, cruise, and flight idle.

11. The gas turbine engine of claim 10, wherein the controller is configured to apply voltage across the thermoelectric section to direct current through the thermoelectric section in a first direction in response to determination that the operational state of the gas turbine engine is one of the takeoff and the climb to encourage heat transfer through the thermoelectric section from the cooling air passageway to the coolant passageway.

12. The gas turbine engine of claim 10, wherein the controller is configured to apply the voltage across the thermoelectric section to direct the current through the thermoelectric section in a second direction in response to determination that the operational state of the gas turbine engine is the flight idle.

13. The gas turbine engine of claim 8, wherein the thermoelectric heat exchanger is configured to provide no electric power to the thermoelectric section in response to determination that the operational state of the gas turbine engine is the ground idle.

14. The gas turbine engine of claim 8, wherein the controller is further configured to selectively apply the voltage across the thermoelectric layer based on a predicted operational state of the gas turbine engine.

15. A method of operating a gas turbine engine for providing propulsion for an aircraft, the method comprising
determining an operational state of the gas turbine engine as one of ground idle, takeoff, climb, cruise, and flight idle,
comparing a thermal differential existing between a cooling air system and a coolant system of the gas turbine engine to a predetermined threshold corresponding to the operational state of the gas turbine engine,
based on the determined operational state and a result of the comparing of the thermal differential to the predetermined threshold corresponding to the operational state of the gas turbine engine, selectively:
applying voltage across a thermoelectric section of a thermoelectric heat exchanger of the gas turbine engine in response to determination that the thermal differential does not exceed the predetermined threshold, or
extracting electric power from the thermoelectric section of the thermoelectric heat exchanger in response to determination that the thermal differential does exceed the predetermined threshold.

16. The method of operating a gas turbine engine of claim 15, wherein selectively applying voltage across the thermoelectric section of the thermoelectric heat exchanger includes, in response to determination that the thermal differential does not exceed the predetermined threshold based on the determined operational state, selectively directing current through the thermoelectric section in a first direction to encourage heat transfer through the thermoelectric section from the cooling air system to the coolant system based on the determined operational state.

17. The method of operating a gas turbine engine of claim 15, wherein selectively applying voltage across the thermoelectric section of the thermoelectric heat exchanger includes, in response to determination that the thermal differential does not exceed another predetermined threshold based on the determined operational state, selectively directing current through the thermoelectric section in a second direction.

18. The method of operating a gas turbine engine of claim 15, wherein the predetermined threshold varies with a corresponding operational state of the gas turbine engine.

* * * * *